US010830833B1

(12) United States Patent
Brinkoetter

(10) Patent No.: US 10,830,833 B1
(45) Date of Patent: Nov. 10, 2020

(54) COAXIAL CABLE TESTING CONNECTOR ASSEMBLIES AND METHODS

(71) Applicant: Thomas Richard Brinkoetter, Reno, NV (US)

(72) Inventor: Thomas Richard Brinkoetter, Reno, NV (US)

( * ) Notice: Subject to any disclaimer, the term of this patent is extended or adjusted under 35 U.S.C. 154(b) by 262 days.

(21) Appl. No.: 15/875,423

(22) Filed: Jan. 19, 2018

(51) Int. Cl.
*H01R 9/05* (2006.01)
*H01R 24/40* (2011.01)
*H01R 103/00* (2006.01)
*G01R 31/58* (2020.01)

(52) U.S. Cl.
CPC ............ *G01R 31/58* (2020.01); *H01R 9/0524* (2013.01); *H01R 9/0527* (2013.01); *H01R 24/40* (2013.01); *H01R 2103/00* (2013.01)

(58) Field of Classification Search
CPC ...... H01R 9/0524; H01R 9/0527; H01R 9/05; H01R 2103/00; H01R 24/40
See application file for complete search history.

(56) References Cited

U.S. PATENT DOCUMENTS 7,803,018 B1 * 9/2010 Islam ................... H01R 24/564
439/583
9,124,010 B2 * 9/2015 Eriksen ................ H01R 9/0524

FOREIGN PATENT DOCUMENTS

GB          2467042 A  *  7/2010    ........... H01R 9/0527

* cited by examiner

*Primary Examiner* — Nguyen Tran
*Assistant Examiner* — Paul D Baillargeon
(74) *Attorney, Agent, or Firm* — Michael W. Goltry; Robert A. Parsons; Parsons & Goltry, PLLC

(57) ABSTRACT

A coaxial cable testing assembly includes an electrically conductive fixture including first and second sections, and an electrically conductive radio frequency (RF) connector pin carried by an electrically insulative body carried by the second section. The pin extends away from the receiving area from a connection end of the pin proximate to the receiving area and through and beyond the body to a connector end of the pin. An inner contact is electrically connected to the pin at the connection end. An outer contact is electrically connected to the fixture. The inner and outer contacts electrically contact coaxial inner and outer conductors, respectively, of the end of the coaxial cable, the body electrically isolates the RF connector pin from the fixture, and the fixture frictionally engages the coaxial cable, when the end of the coaxial cable is inserted into the receiving area.

18 Claims, 11 Drawing Sheets

US 10,830,833 B1

COAXIAL CABLE TESTING CONNECTOR ASSEMBLIES AND METHODS

FIELD OF THE INVENTION

The present invention relates to apparatus and methods for testing and evaluating coaxial cables, including feed lines and transmission lines.

BACKGROUND OF THE INVENTION

It is standard practice in the telecommunications field to test coaxial cables. Common forms of testing include continuity, return loss (RL), time domain reflectometry (TDR), and distance-to-fault (DTF). The testing equipment is connected to one end of the cable for many of these tests using a connector that provides one of the standard RF interfaces, such as DIN or N.

Current practice requires the installation of a connector on the cable to be tested. The connector is an interface between the cable to be tested and the chosen test equipment. Existing connectors are expensive, and are difficult and time-consuming to install on the cable and to remove from the cable following testing, necessitating highly specialized skilled.

Given these and other shortcomings in the art, there is a need for a coaxial cable testing connector that is inexpensive, and easy to install temporarily on a coaxial cable, and easy to remove from a coaxial cable all without requiring extensive cable preparation, specialized skill, or specialized tools.

SUMMARY OF THE INVENTION

According to the principle of the invention, a coaxial cable testing assembly includes a fixture, a body, a radio frequency (RF) connector pin, an inner contact, and an outer contact. The fixture is electrically conductive and includes a first section and a second section. The first section defines a receiving area adapted to receive an end of a coaxial cable. The body is carried by the second section and is electrically insulative. The RF connector pin is electrically conductive, includes a connection end and a connector end, and is carried by the body. The RF connector pin extends away from the receiving area from the connection end proximate to the receiving area and through and beyond the body to the connector end. The inner contact is electrically connected to the RF connector pin at the connection end. The outer contact is electrically connected to the fixture. The inner contact and the outer contact electrically contact coaxial inner and outer conductors, respectively, of the end of the coaxial cable concurrently electrically connecting the end of the coaxial cable to the fixture and to the RF connector pin, the body electrically isolates the RF connector pin from the fixture, and the fixture frictionally engages the coaxial cable, when the end of the coaxial cable is inserted into the receiving area. The connector end of the RF connector pin resides in a connector area defined by the second section of the fixture. The outer contact and the inner contact are coaxial. The outer contact includes flexible prongs that deflect and electrically contact the outer conductor of the end of the coaxial cable, when the end of the coaxial cable is inserted into the receiving area. The inner contact includes flexible prongs that deflect and electrically contact the inner conductor of the end of the coaxial cable, when the end of the coaxial cable is inserted into the receiving area.

A coaxial cable testing assembly includes a fixture, a body, a radio frequency (RF) connector pin, an inner contact, and an outer contact. The fixture is electrically conductive and includes a first section and a second section. The first section defines a first area and the second section defines a second area. The body is electrically insulative and is carried by the second section in the second area. The RF connector pin is electrically conductive, includes a connection end and a connector end, and is carried by the body. The RF connector pin extends away from the receiving area from the connection end proximate to the receiving area and through the second area through and beyond the body to the connector end. The connector end of the RF connector pin resides in a connector area of the second area defined by the second section of the fixture. The inner contact and an outer contact are in the first area. The inner contact is electrically connected to the RF connector pin at the connection end. The outer contact is electrically connected to the fixture. The inner contact and the outer contact electrically contact coaxial inner and outer conductors, respectively, of an end of a coaxial cable concurrently electrically connecting the end of the coaxial cable to the fixture and to the RF connector pin, the body electrically isolates the RF connector pin from the fixture, and the fixture frictionally engages the coaxial cable, when the end of the coaxial cable is inserted into the first area. The first area, the second area, and the RF connector pin are coaxial. The outer contact and the inner contact are coaxial. The outer contact includes flexible prongs that deflect and electrically contact the outer conductor of the end of the coaxial cable, when the end of the coaxial cable is inserted into the first area. The inner contact includes flexible prongs that deflect and electrically contact the inner conductor of the end of the coaxial cable, when the end of the coaxial cable is inserted into the first area.

A coaxial cable testing assembly includes a fixture, a body, a radio frequency (RF) connector pin, an inner contact, and an outer contact. The fixture is electrically conductive and includes a first section and a second section. The first section defines a receiving area adapted to receive an end of a coaxial cable. The body is carried by the second section and is electrically insulative. The RF connector pin is electrically conductive, and includes a connection end, a connector end, and an inner contact. The inner contact is carried by a contact seat in the connection end, is electrically connected to the RF connector pin at the connection end, and includes flexible prongs. The RF connector pin extends away from the receiving area from the inner contact in the receiving area and through and beyond the body to the connector end. The outer contact is electrically connected to the fixture. The flexible prongs of the inner contact deflect and electrically contact an inner conductor of the end of the coaxial cable and the outer contact electrically contacts an outer conductor of the end of the coaxial cable, concurrently electrically connecting the end of the coaxial cable to the fixture and to the RF connector pin, the body electrically isolates the RF connector pin from the fixture, and the fixture frictionally engages the coaxial cable, when the end of the coaxial cable is inserted into the receiving area. The seat includes a groove. The inner contact further includes a severed annular member, the prongs are carried by the severed annular member, and the severed annular member is seated in the groove. The connector end of the RF connector pin resides in a connector area defined by the second section of the fixture. The outer contact and the inner contact are coaxial.

A coaxial cable testing assembly includes a fixture, a body, a radio frequency (RF) connector pin, an inner contact, and an outer contact. The fixture is electrically conductive and includes a first section and a second section. The first section includes a seat and defines a receiving area adapted to receive an end of a coaxial cable. The body is carried by the second section and is electrically insulative. The RF connector pin is electrically conductive, includes a connection end and a connector end, and is carried by the body. The RF connector pin extends away from the receiving area from the connection end proximate to the receiving area and through and beyond the body to the connector end. The inner contact is electrically connected to the RF connector pin at the connection end. The outer contact is carried by a contact seat in the fixture, is electrically connected to the fixture, and includes flexible prongs. The inner contact electrically contacts an inner conductor of the end of the coaxial cable and the flexible prongs of the outer contact deflect and electrically contact an outer conductor of the end of the coaxial cable, concurrently electrically connecting the end of the coaxial cable to the fixture and to the RF connector pin, the body electrically isolates the RF connector pin from the fixture, and the fixture frictionally engages the coaxial cable, when the end of the coaxial cable is inserted into the receiving area. The seat includes a groove. The outer contact further includes a severed annular member, the prongs are carried by the severed annular member, and the severed annular member is seated in the groove. The connector end of the RF connector pin resides in a connector area defined by the second section of the fixture. The outer contact and the inner contact are coaxial.

BRIEF DESCRIPTION OF THE DRAWINGS

Referring to the drawings.

DETAILED DESCRIPTION

Figure 1:
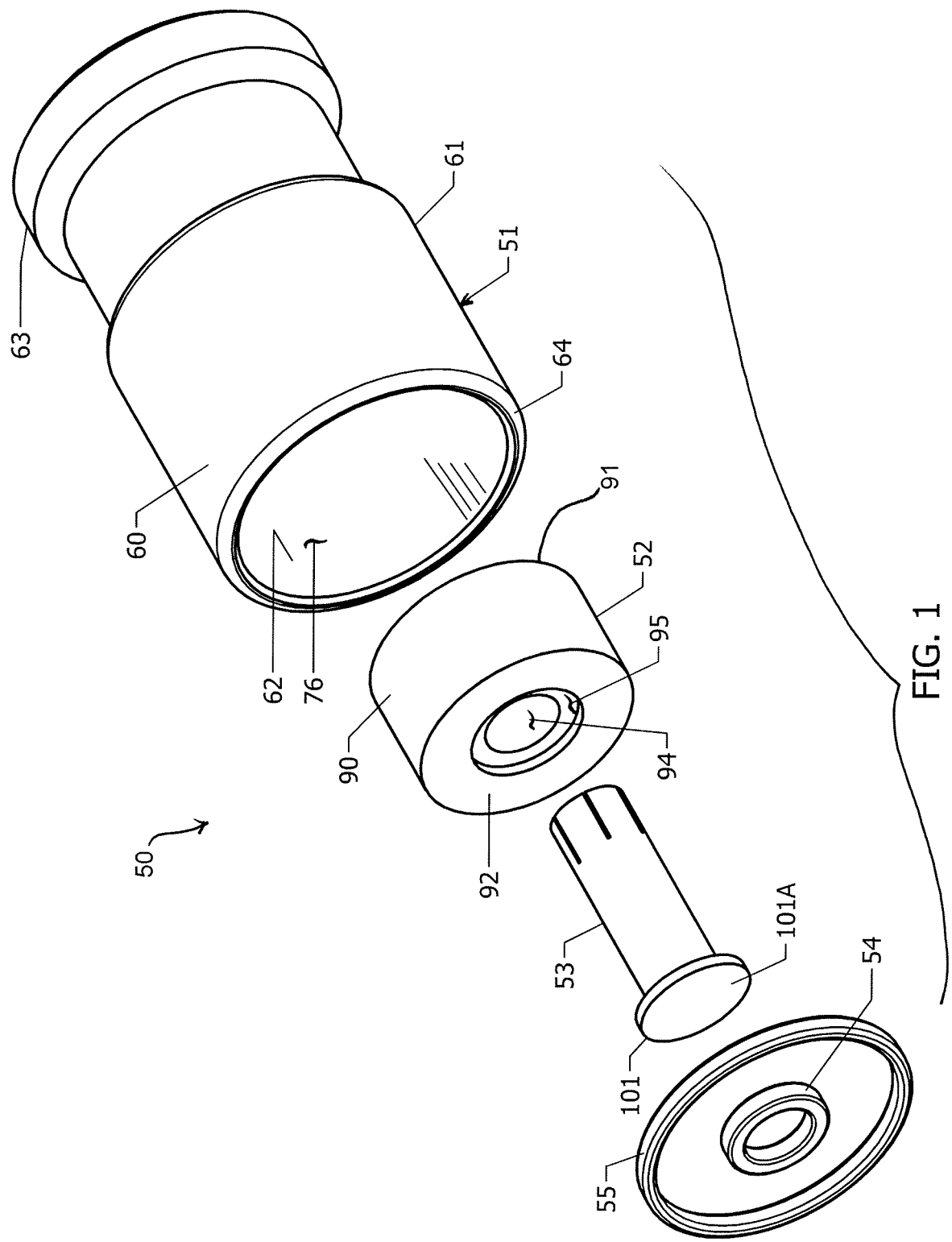
FIG. 1 is an exploded isometric view of a coaxial cable testing connector assembly constructed and arranged in accordance with the principle of the invention.

Disclosed herein are illustrative embodiments of test connector assemblies adapted to be installed on coaxial cables temporarily for testing purposes. The connector assemblies and methods quickly and simply enable connection to standard test equipment for cable testing purposes, all without requiring the installation of a permanent connector to the cable, and while providing the performance characteristics required for complete testing. The connector assemblies are adapted to provide sufficient radio frequency (RF) and electrical connection for cable testing purposes. The connector assemblies include a fixture that has a cable section that slips and fits over the end of a coaxial cable with a standard RF connector interface on an opposed connector section of the fixture. Contacts carried the fixture electrically connect the cable inner and outer conductors to the connector section of the fixture.

The various connector assembly embodiments of the invention include a fixture, a shell, a mechanical support for the elements of the connector assembly, that fits frictionally over a cable end and provides an RF connection to the cable under test, typically with a 7-16 DIN or N interface on the RF connector end of the device.

The apparatus and methods disclosed herein are useful by cable manufacturers, distributors, and users of coaxial cables or feed lines. By connecting the cable end according to the invention, testing or evaluation of the cable can be performed at all points in the supply chain. Testing can be performed by the end user upon delivery and acceptance of the cable. An installer or end user can test the cable prior to, during, and after installation of the cable.

Those having regard for the art will readily appreciate that the embodiments of the invention disclosed in detail herein conveniently and inexpensively provide for a temporary RF connection to the cable for enabling cable testing. Performance characteristics of the test connectors disclosed herein enable detailed testing analysis with standard and state-of-the art techniques, such as TDR or DTF.

The various illustrative embodiments of the invention will now be discussed in conjunction with FIGS. 1-19, in which like reference characters indicate corresponding elements throughout the several views.

A.

Figure 2:
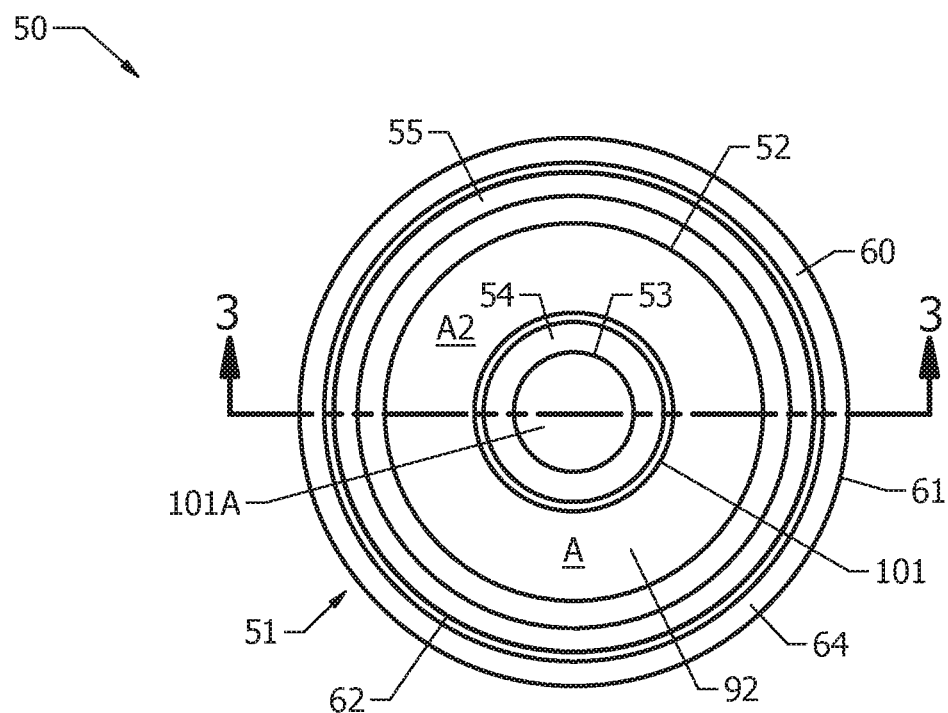
FIG. 2 is a top plan view of the embodiment of FIG. 1 shown assembled.
Figure 3:
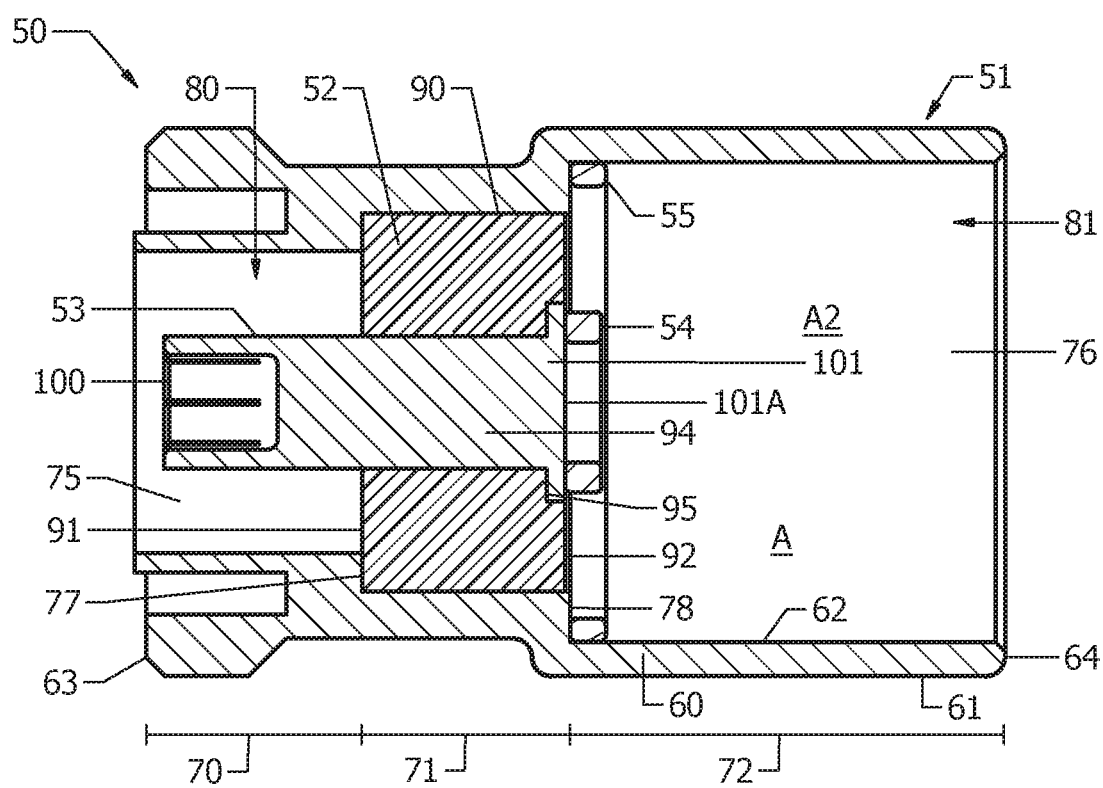
FIG. 3 is a section view taken along line 3-3 of FIG. 2.

FIG. 1 is an exploded isometric view of a coaxial cable testing connector assembly 50, FIG. 2 is a top plan showing the embodiment of FIG. 1 as it would appear assembled, and FIG. 3 is a section view taken along line 3-3 of FIG. 2.

Referring to FIGS. 1-3 in relevant part, assembly 50 includes fixture 51, body 52, radio frequency (RF) connector pin 53, inner contact 54, and outer contact 55. Fixture 51 is electrically conductive, being formed of metal, such as brass, stainless steel, or other electrically conductive material or combination of materials. Fixture 51, a hollow shell, includes continuous sidewall 60 having outer surface 61, inner surface 62, connector end 63, and cable end 64. In FIG. 3, inner surface 62 defines bore 70, and two stepped counterbores, including counterbore 71, and counterbore 72. Counterbore 71, is between bore 70 and counterbore 72, and is, therefore, an intermediate counterbore of fixture 51. Connector end 63 encircles opening 75 to bore 70. Cable end 64 encircles opening 76 to counterbore 72. Bore 70, counterbore 71, and counterbore 72 are coaxial, and define the internal area or volume A of fixture 51, which extends from opening 75 of connector end 63 to opening 76 of cable end 64. Counterbore 71 is enlarged relative to bore 70, and counterbore 72 is enlarged relative to counterbore 71. Bore 70 extends from opening 75 to annular step 77 of counterbore 71, counterbore 71 extends from step 77 to annular step 78 of counterbore 72, and counterbore 72 extends from step 78 to opening 76. Accordingly, fixture 51 is a hollow shell, a generally cylindrical shell, that defines volume A that extends from opening 75 of connector end 63 to opening at cable end 64, and volume A is further defined by sub-areas or sub-volumes, including area A1 and area A2.

Fixture 51 defines two sections 80 and 81. Section 80, a connector section, is adapted to be connected to standard cable-testing equipment, includes bore 70 and counterbore 71, and extends from opening 75 of connector end 63 to step 78. Section 55, a cable section, is defined by counterbore 72, and extends from step 78 to opening 76 of cable end 64. Bore 70 and counterbore 71 define area A1 of fixture 51 area A, and counterbore 72 defines an area A2 of fixture 51 area A. Area A1 is a connector area that receives and houses body 52 and pin 53, and area A2 is a cable area, namely, a receiving area for a coaxial cable. Fixture 51 is formed integrally, is generally cylindrical in overall shape, and is symmetrical about its central axis X. All components of assembly 50 are arranged about axis X.

Body 52 is an insulator, a dielectric, being formed of an electrically non-conducting material or combination of materials. Accordingly, body 52 is inherently electrically insulative and electrically non-conductive. Body 52 is generally cylindrical in shape and includes cylindrical outer surface 90 that extends between connector end surface 91 and cable end surface 92. Connector end surface 91 and cable end surface 92 are parallel relative to each other. Central hole 94 extends through body 52 from connector end surface 91 to cable end surface 92. Hole 94 is counterbored, being formed with counterbore 95 at cable end surface 92, a cylindrical flat-bottomed hole that enlarges hole 94 at cable end surface 92.

Body 52 is situated in area A1 and is press-fit into counterbore 71. Connector end surface 91 is fit against step 77, outer surface 90 is fit against inner surface 62 of counterbore 71, body 52 extends through area A1 from connector end surface 91 at step 77 to cable end surface 92 proximate to step 78 without extending into area A2. Body 52 is arranged about axis X, which extends centrally through hole 94 from connector end surface 91 to cable end surface 92.

Pin 53 is electrically conductive, being formed of metal, such as brass, silver plated brass, or other electrically conductive material or combination of materials customarily used for RF connector pins. Pin 53, an RF connector pin, is elongate and includes connector end 100 and opposed connection end 101, which is an enlarged, flat, circular head having connection surface 101A.

Pin 53 is situated in area A1, and is carried by body 52. Pin 53 is press-fit into hole 94 of body 52. Connection end 101 is fit or otherwise seated in counterbore 85 and is in area A1 proximate to area A2. Connection surface 101A of pin 53 and cable end surface 92 of body 52 are flush and reside in area A1 slightly withdrawn from area A2, connection surface 101A faces area A2, and pin 53 extends away from area A2 through area A1 from connection end 101 proximate to area A2 through hole 94 from cable end surface 92 to connector end surface 91 and beyond connector end surface 91 of body 52 in area A1 to connector end 100, which is in area A1 in-board of opening 75 of connector end 73 at a chosen location in area A1 for enabling connection of connector end 100 to the chosen test equipment. Connector end 100 is a standard connector end configured to correspond to chosen RF connector specifications of connector section 80.

Body 52 and pin 53 form part of connector section 80 of assembly 50, when body 52 and pin 53 are installed in section 80. Section 80, including the part of fixture 51 that defines section 80 and pin 53 installed therein, is conventionally arranged to connect to chosen cable-testing equipment in a manner that is known in the art for providing sufficient RF and electrical connection between a cable to be tested and the chosen cable-testing equipment.

Inner and outer contacts 54 and 55 in area A2 are annular contacts each formed of metal, metallic braid, a compliant electro-magnetic interference gasket material, conductive elastomer material that is inherently compliant, conductive thermoplastic, a compliant contact in the nature of an electrically conductive mesh applied about foam or other deformable material or combination of materials, or other electrically conductive material or combination of materials. Inner and outer contacts 54 and 55 are preferably compliant to promote electrical contact to the inner and outer conductors of the coaxial cable to be tested. Inner and outer contacts 54 and 55 are inherently flexible and resilient and compress/deflect from their at-rest orientations to enable competent electrical contact to the inner and outer conductors of a coaxial cable when the coaxial cable to be tested is inserted into area A2, and recover or reset to their at-rest orientations, their uncompressed/unflexed orientations, when the tested coaxial cable is withdrawn from area A2.

Inner contact 54 is electrically connected to pin at connection end 101. Outer contact 55 is electrically connected to fixture 51. Specifically, inner contact 54 in area A2 is applied to, atop, and in direct contact against, connection surface 101A of connection end 101 of pin 53, and extends into area A2 from connection surface 101A. Outer contact 55 in area A2 is applied to, atop, and in direct contact against, step 78 of fixture 51, is in direct contact against inner surface 62 of fixture 51, and extends into area A2 from step 78. Inner contact 54 in area A2 electrically contacts pin 53 at connection surface 101A of connection end 101. Outer contact 55 electrically contacts fixture 51 at step 78 and at inner surface 62. Inner and outer contacts 54 and 55 are coaxial and are arranged about axis X. Outer contact 55 relates to the outer conductor of a coaxial cable end to be tested, and encircles inner contact 54 that relates to the inner conductor of the coaxial cable end to be tested.

Figure 4:
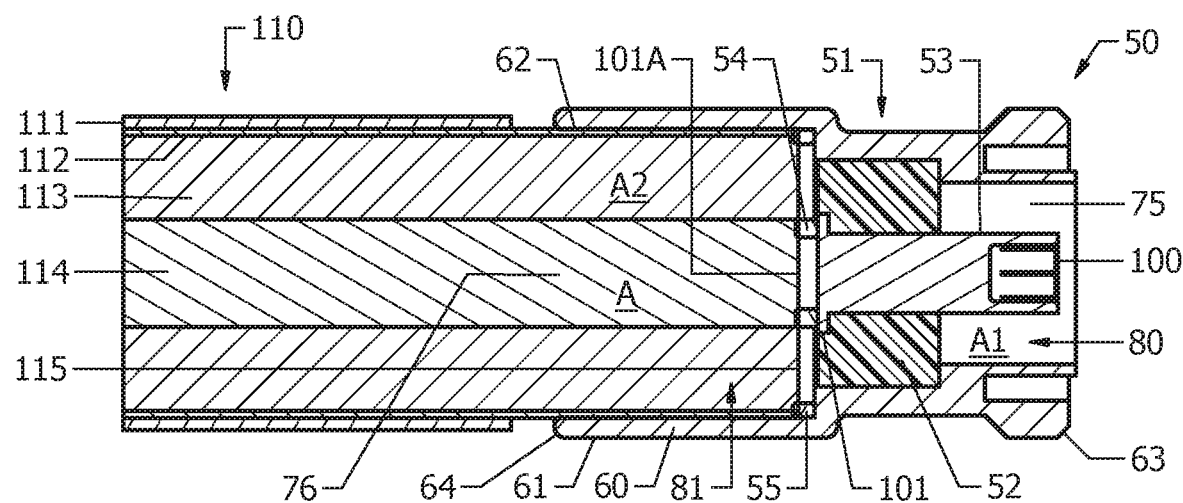
FIGS. 4-8 are section views corresponding to FIG. 3 illustrating the connector assembly of FIGS. 1-3 as it would appear connected to different configurations of coaxial cables to be tested.

FIGS. 4-8 are section views corresponding to FIG. 3 illustrating different configurations of coaxial cables shown as they would appear connected to assembly 50 of FIGS. 1-3. In FIG. 4, cable 110, a general coaxial cable, includes outer jacket 111, outer conductor 112, dielectric 113, and inner conductor 114. Outer conductor 112 is a woven braid, a wrapped conductive film, or a smooth-walled metallic tube, such as of aluminum or copper. Inner conductor 114 is either a stranded conductor or a solid conductor. End 115 of cable 110 is stripped of outer jacket 111, exposing outer conductor 112. End 115 is inserted into area A2, the receiving area or cable-receiving area of assembly 50, through opening 76 of section 81 of assembly 50. Assembly 50 is slipped over and pressed onto and over end 115, such as by hand without the need for specialized skill or tools. Concurrently, inner surface 62 of counterbore 72 of fixture 51 frictionally engages outer conductor 112 of cable 110 end 115, outer conductor 112 of cable 110 end 115 electrically contacts outer contact 55, and inner conductor 114 of cable 110 end 115 electrically contacts inner contact 54. The concurrent electrical contact of outer conductor 112 to outer contact 55 and inner conductor 114 to inner contact 54 electrically connects outer conductor 112 to fixture 51 and electrically connects inner conductor 114 to pin 53, completing the connection from cable end 115 to the connector section 80, the RF connector end of assembly 50. Inner contact 54 and outer contact 55 electrically contact coaxial inner and outer conductors 114 and 112, respectively, of end 115 of cable 110 concurrently electrically connecting end 115 of cable 110 to fixture 51 and to pin 53, body 53 electrically isolates pin 53 from fixture 51, and fixture 53 frictionally engages cable 110, when end 115 of cable 110 is inserted into area A2. After cable 110 is tested with assembly 50 by connecting section 80 to the chosen test equipment, assembly 50 can be taken up by hand or with a tool and simply pulled free of cable 110 end 115. Assembly 50 can be used repeatedly to test cables as needed.

Figure 5:
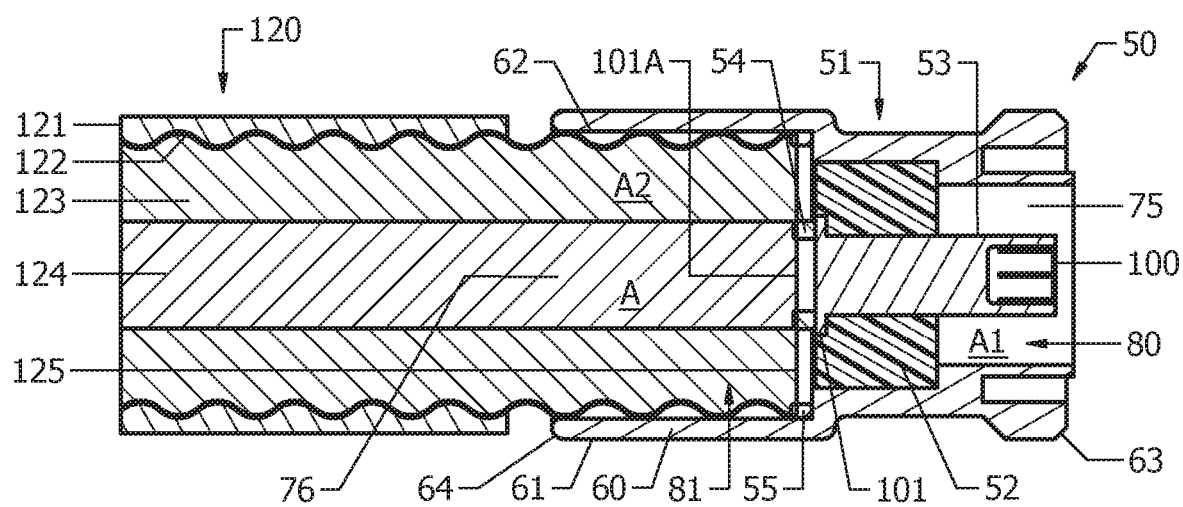

In FIG. 5, cable 120, a coaxial cable useful in a fixed installation, not subject to constant flexing, includes outer jacket 121, outer conductor 122, dielectric 123, and inner conductor 124. In this example, outer conductor 122 is a corrugated metallic tube, such as of copper or aluminum, and inner conductor 124 is a solid metallic conductor, copper plated aluminum in this example. End 125 of cable 120 is stripped of outer jacket 121, exposing outer conductor 122. End 125 is inserted into area A2, the receiving area or cable-receiving area of assembly 50, through opening 76 of section 81 of assembly 50. Assembly 50 is slipped over and pressed onto and over end 125, such as by hand without the need for specialized skill or tools. Concurrently, inner surface 62 of counterbore 72 of fixture 51 frictionally engages outer conductor 122 of cable 120 end 125, outer conductor 122 of cable 120 end 125 electrically contacts outer contact 55, and inner conductor 124 of cable 120 end 125 electrically contacts inner contact 54. The concurrent electrical contact of outer conductor 122 to outer contact 55 and inner conductor 124 to inner contact 54 electrically connects outer conductor 122 to fixture 51 and electrically connects inner conductor 124 to pin 53, completing the connection from cable end 125 to the connector section 80, the RF connector end of assembly 50. Inner contact 54 and outer contact 55 electrically contact coaxial inner and outer conductors 124 and 122, respectively, of end 125 of cable 120 concurrently electrically connecting end 125 of cable 110 to fixture 51 and to pin 53, body 53 electrically isolates pin 53 from fixture 51, and fixture 53 frictionally engages cable 120, when end 125 of cable 120 is inserted into area A2. After cable 120 is tested with assembly 50 by connecting section 80 to the chosen test equipment, assembly 50 can be taken up by hand or with a tool and simply pulled free of cable 120 end 125. Again, assembly 50 can be used repeatedly to test cables as needed.

Figure 6:
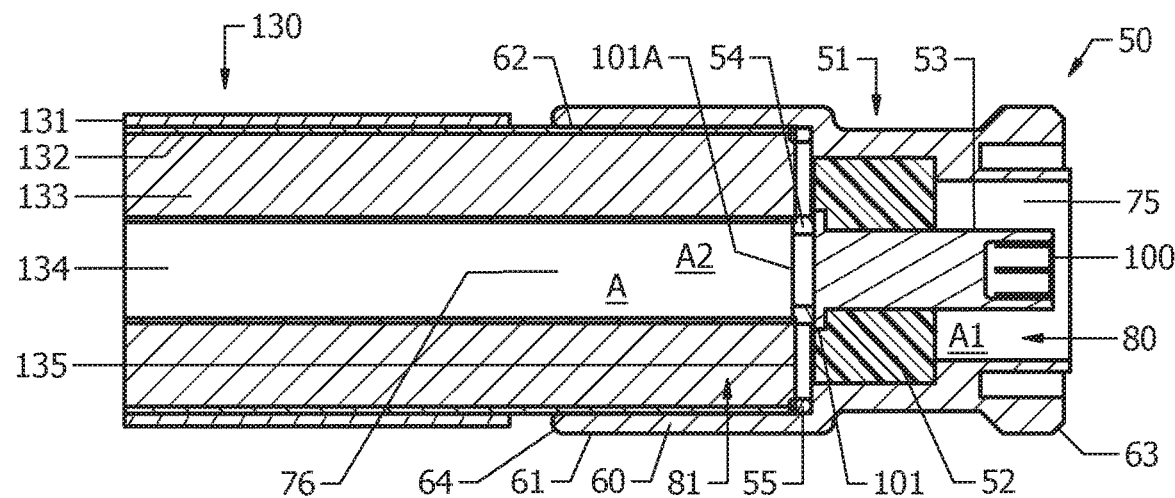

In FIG. 6, cable 130, a coaxial cable useful in a fixed installation, not subject to constant flexing, includes outer jacket 131, outer conductor 132, dielectric 133, and inner conductor 134. Outer conductor 132 can be a woven braid, a wrapped conductive film, or a smooth-walled metallic tube, such as of copper or aluminum. Inner conductor 134 is a hollow metallic tube, such as of copper or aluminum. End 135 of cable 130 is stripped of outer jacket 131, exposing outer conductor 132. End 135 is inserted into area A2, the receiving area or cable-receiving area of assembly 50, through opening 76 of section 81 of assembly 50. Assembly 50 slipped over and is pressed onto and over end 135, such as by hand without the need for specialized skill or tools. Concurrently, inner surface 62 of counterbore 72 of fixture 51 frictionally engages outer conductor 132 of cable 130 end 135, outer conductor 132 of cable 130 end 135 electrically contacts outer contact 55, and inner conductor 134 of cable 110 end 135 electrically contacts inner contact 54. The concurrent electrical contact of outer conductor 132 to outer contact 55 and inner conductor 134 to inner contact 54 electrically connects outer conductor 132 to fixture 51 and electrically connects inner conductor 134 to pin 53, completing the connection from cable end 135 to the connector section 80, the RF connector end of assembly 50. Inner contact 54 and outer contact 55 electrically contact coaxial inner and outer conductors 134 and 132, respectively, of end 135 of cable 130 concurrently electrically connecting end 135 of cable 130 to fixture 51 and to pin 53, body 53 electrically isolates pin 53 from fixture 51, and fixture 53 frictionally engages cable 130, when end 135 of cable 130 is inserted into area A2. After cable 130 is tested with assembly 50 by connecting section 80 to the chosen test equipment, assembly 50 can be taken up by hand or with a tool and simply pulled free of cable 130 end 135. Again, assembly 50 can be used repeatedly to test cables as needed.

Figure 7:
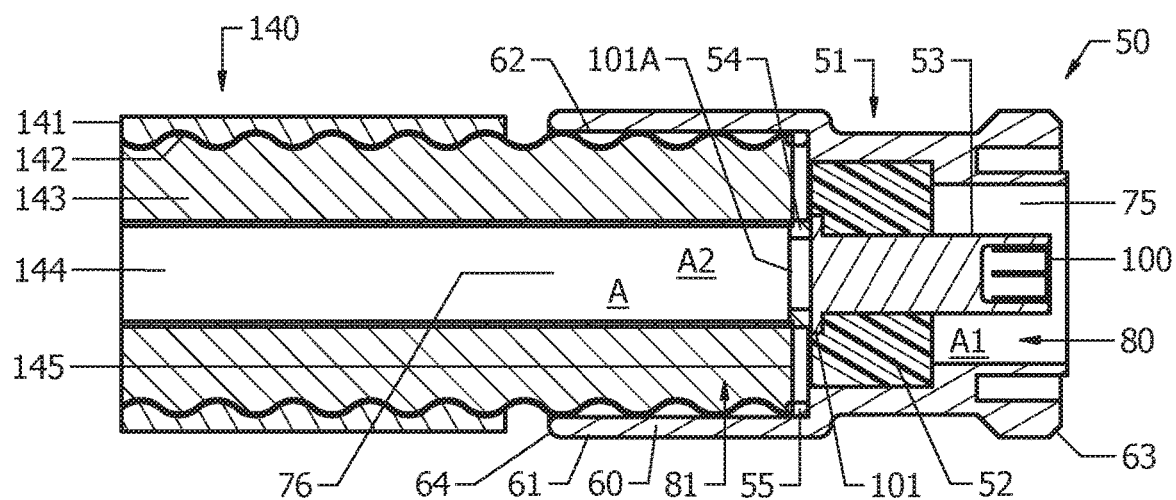

In FIG. 7, cable 140, a coaxial cable useful in a fixed installation, not subject to constant flexing, includes outer jacket 141, outer conductor 142, dielectric 143, and inner conductor 144. In this example, outer conductor 142 is a corrugated metallic tube, such as of aluminum or copper. Inner conductor 144 is a hollow metallic tube, copper or aluminum in this example. End 145 of cable 140 is stripped of outer jacket 141, exposing outer conductor 142. End 145 is inserted into area A2, the receiving area or cable-receiving area of assembly 50, through opening 76 of section 81 of assembly 50. Assembly 50 slipped over and is pressed onto and over end 145, such as by hand without the need for specialized skill or tools. Concurrently, inner surface 62 of counterbore 72 of fixture 51 frictionally engages outer conductor 142 of cable 140 end 145, outer conductor 142 of cable 140 end 145 electrically contacts outer contact 55, and inner conductor 144 of cable 140 end 145 electrically contacts inner contact 54. The concurrent electrical contact of outer conductor 142 to outer contact 55 and inner conductor 144 to inner contact 54 electrically connects outer conductor 142 to fixture 51 and electrically connects inner conductor 144 to pin 53, completing the connection from cable end 145 to the connector section 80, the RF connector end of assembly 50. Inner contact 54 and outer contact 55 electrically contact coaxial inner and outer conductors 144 and 142, respectively, of end 145 of cable 140 concurrently electrically connecting end 145 of cable 140 to fixture 51 and to pin 53, body 53 electrically isolates pin 53 from fixture 51, and fixture 53 frictionally engages cable 140, when end 145 of cable 140 is inserted into area A2. After cable 140 is tested with assembly 50 by connecting section 80 to the chosen test equipment, assembly 50 can be taken up by hand or with a tool and simply pulled free of cable 140 end 145. Again, assembly 50 can be used repeatedly to test cables as needed.

Figure 8:
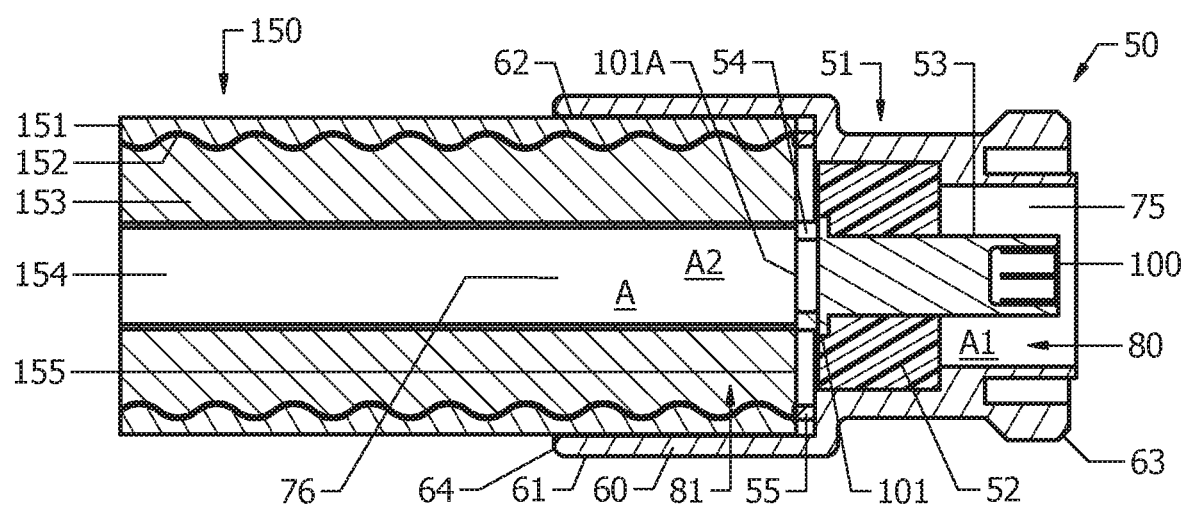

In FIG. 8, cable 150, a coaxial cable useful in a fixed installation, not subject to constant flexing, includes outer jacket 151, outer conductor 152, dielectric 153, and inner conductor 154. In this example, outer conductor 152 is a corrugated metallic tube, such as of aluminum or copper. Inner conductor 154 is a hollow metallic tube, copper or aluminum in this example. End 155 of cable 150 not stripped of outer jacket 151. End 155 is inserted into area A2, the receiving area or cable-receiving area of assembly 50, through opening 76 of section 81 of assembly 50. Assembly 50 is slipped over and is pressed onto and over end 155, such as by hand without the need for specialized skill or tools. Concurrently, inner surface 62 of counterbore 72 of fixture 51 frictionally engages outer jacket 151 of cable 150 end 155, outer conductor 152 of cable 150 end 155 electrically contacts outer contact 55, and inner conductor 154 of cable 150 end 155 electrically contacts inner contact 54. The concurrent electrical contact of outer conductor 152 to outer contact 55 and inner conductor 154 to inner contact 54 electrically connects outer conductor 152 to fixture 51 and electrically connects inner conductor 154 to pin 53, completing the connection from cable end 155 to the connector section 80, the RF connector end of assembly 50. Inner contact 54 and outer contact 55 electrically contact coaxial inner and outer conductors 154 and 152, respectively, of end 155 of cable 150 concurrently electrically connecting end 155 of cable 150 to fixture 51 and to pin 53, body 53 electrically isolates pin 53 from fixture 51, and fixture 53 frictionally engages cable 150, when end 155 of cable 150 is inserted into area A2. After cable 150 is tested with assembly 50 by connecting section 80 to the chosen test equipment, assembly 50 can be taken up by hand or with a tool and simply pulled free of cable 150 end 155. Again, assembly 50 can be used repeatedly to test cables as needed.

Again, inner and outer contacts 54 and 55 are inherently flexible and resilient. Accordingly, in the embodiments of FIGS. 4-8 inner and outer contacts 54 and 55 compress/deflect from their at-rest orientations to enable competent electrical contact to the inner and outer conductors of the corresponding coaxial cable to be tested when the given coaxial cable is inserted into area A2, and recover or reset to their at-rest orientations, their uncompressed/unflexed orientations, when the given tested coaxial cable is withdrawn from area A2.

B.

Figure 9:
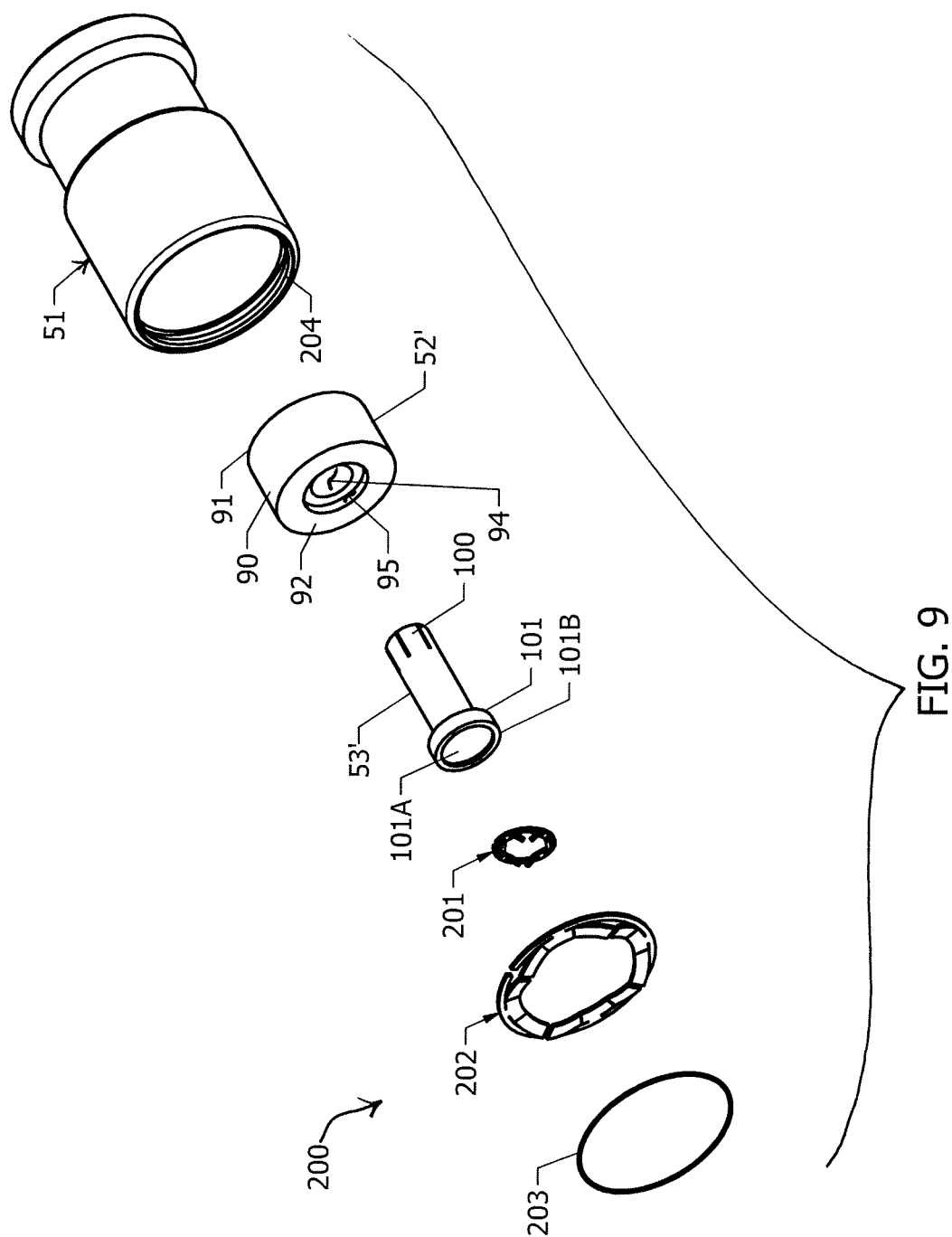
FIG. 9 is an exploded isometric view of another embodiment of a coaxial cable testing connector assembly constructed and arranged in accordance with the principle of the invention.

FIG. 9 is an exploded isometric view of another embodiment of a coaxial cable testing connector assembly 200 constructed and arranged in accordance with the principle of the invention. Assembly 200 is identical in every respect, both in structure and function, to assembly 50, in that assembly 200 shares fixture 51, body 52, and pin 53. Assembly 200 further includes an alternate embodiment of an inner contact 201, an alternate embodiment of an outer contact 202, and a gasket 203, which is applied to annular groove 204 formed in inner surface 62 of counterbore 72 proximate to opening 76 at cable end 64 in FIG. 17. Connection end 101 of pin 53 is modified slightly to accommodate inner contact 201 in assembly 200, and counterbore 95 of body 52 is modified slightly in size to accommodate connection end 101 of pin 53 of assembly 200. Given these modifications to pin 53 and body 52 of assembly 200, reference numerals 53 and 52 in assembly 200 each include a prime ("'") symbol for clarity. Other that these modifications and the alternate embodiments of inner and outer contacts 201 and 202, the previous discussion of assembly 50 applies in every respect to assembly 200.

Figure 16:
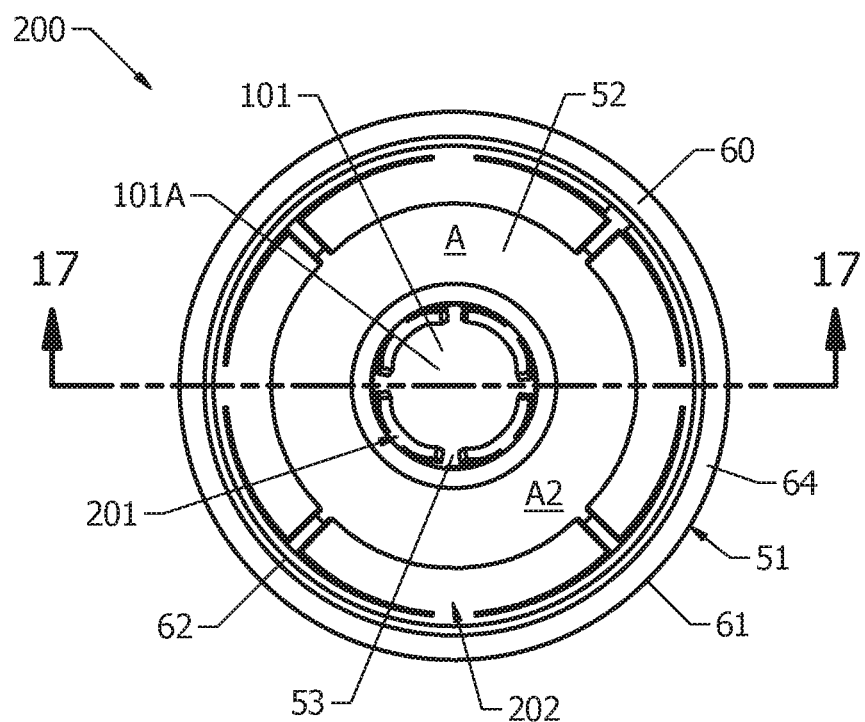
FIG. 16 is a top plan view of the embodiment of FIG. 9 shown assembled.
Figure 17:
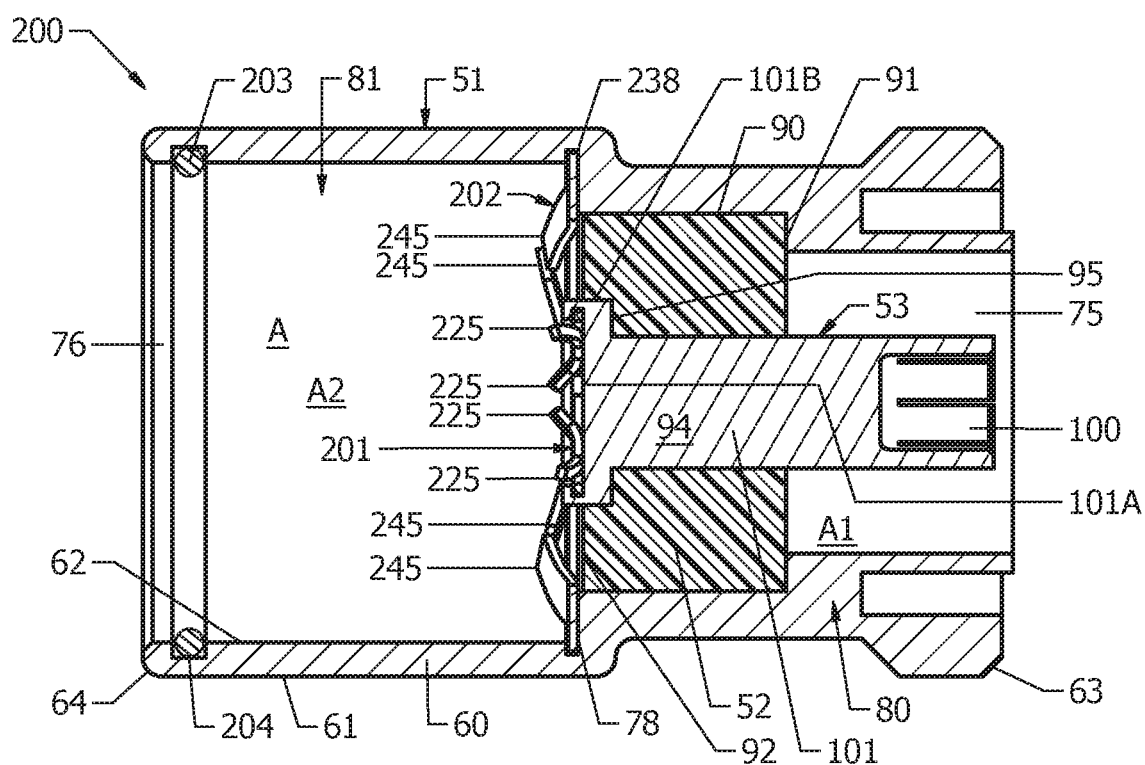
FIG. 17 is a section view taken along line 17-17 of FIG. 16.

In assembly 200 in FIGS. 16 and 17, inner contact 201 replaces inner contact 54 of assembly 50, outer contact 202 replaces outer contact 55 of assembly 50, inner contact 201 is electrically connected to pin 53' at connection end 101, outer contact 202 is electrically connected to fixture 51, and inner contact 201 and outer contact 202 are coaxial and arranged about axis X like inner and outer contacts 54 and 55 of assembly 50.

Inner and outer contacts 201 and 202 are each formed of an electrically conductive material or combination of materials having inherently flexible, resilient, and shape memory material characteristics, such as steel or other malleable metal. Inner and outer contacts 201 and 201 are flexible and compliant to promote electrical contact to the inner and outer conductors of the chosen coaxial cable to be tested when the chosen coaxial cable is inserted into area A2 for testing.

Figure 15:
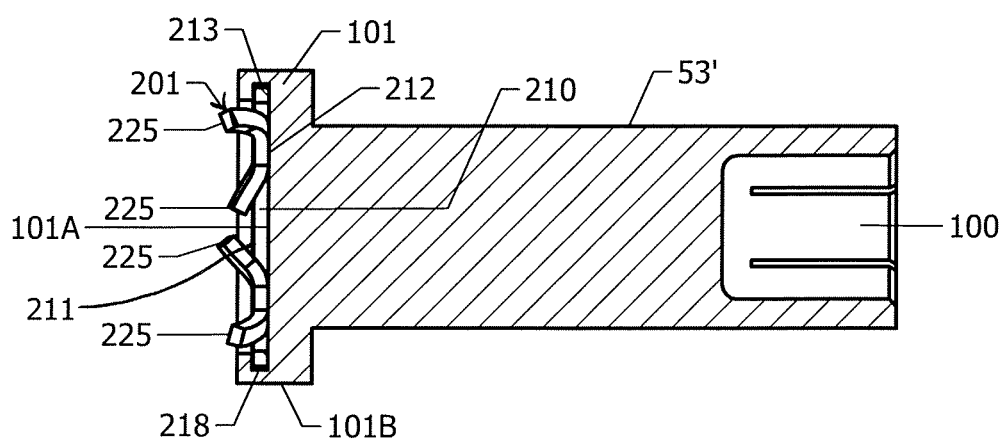
FIG. 15 is a section view taken along line 15-15 of FIG. 14.

Inner contact 201 includes annular member 210, and prongs 225. Prongs 225 are carried by, or otherwise are supported by, annular member 210, which is a severed annular member as described below. Annular member 210 has an upper first radial surface 211, a lower second radial surface 212, an outer surface 213, an opposed inner surface 214, and an end gap 215 that severs annular member 210 and that defines spaced-apart first and second ends 216 and 217 of annular member 210. In FIG. 15, connection end 101 of pin 53' of assembly 200 (FIG. 9) is, as in assembly 50, an enlarged, flat, circular head having connection surface 101A, but is somewhat thicker in this example and is formed with an annular groove 218 formed in perimeter edge 101A of connection end 101 of pin 53' in FIG. 15 proximate to connection surface 101A.

Figure 10:
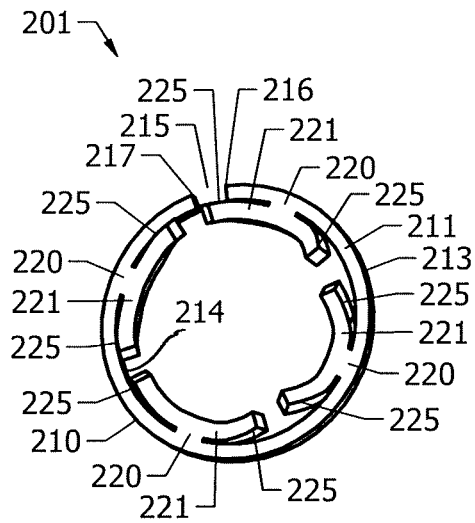
FIG. 10 is a top plan view of an inner contact of the embodiment of FIG. 9.
Figure 11:
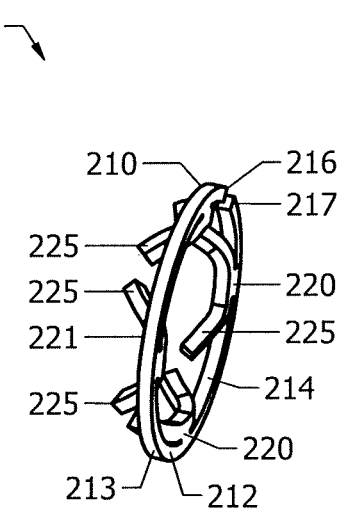
FIG. 11 is a perspective view of the embodiment of FIG. 10.

In FIGS. 10 and 11, annularly spaced-apart tabs 220 extend inwardly from inner surface 214, and connect inner surface 214 to annularly spaced-apart, outwardly curved, elongate members 221 each having opposed free ends that are out-turned upwardly relative to upper first radial surface 211 forming prongs 225. Each tab 220 connects a middle of a corresponding elongate member 221 to inner surface 214, and each elongate member 221 extends outwardly from either side of the corresponding tab 220 to its corresponding prongs 225. Inner surface 214 encircles elongate members 221. Prongs 225, the opposed, upturned free ends of elongate members 221, extend upwardly relative to upper first radial surface 211, and extend outwardly from connection surface 101A of connection end 101 of pin 53' in FIGS. 14 and 15. Prongs 225 are inherently springy/flexible and flex when under pressure, and have an inherent shape memory material characteristic enabling prongs 225 to recover and resume their original shapes in the absence of applied pressure.

Groove 218 is an outwardly directed groove in that it extends outwardly relative axis X in assembly 200. Annular member 210, a severed tensionable, annular member, is dimensioned to be received under tension within annular groove 218 formed in perimeter edge 101A of connection end 101 of pin 53' in FIG. 15 proximate to connection surface 101A, when lower second radial surface 212 is positioned directly against connection surface 101A. To assemble inner contact 201 and pin 53' to form the pin assembly, annular member 210 is initially closed, bringing first and second ends 216 and 217 together closing end gap 215, such as by hand, lower second radial surface 212 is initially seated centrally in direct contact against connection surface 101A, and is then released enabling annular member 210 to snap outwardly into groove 218. Annular member 210 is elastically expansive and, thus, has an inherent expansive property or characteristic. Annular member 210 is tensioned due to its inherent expansive characteristic urging outer surface 213 in engagement against groove 218, when annular member 210 installs in groove 218. Lower second radial surface 212 is in direct contact with connection surface 101A and annular member 210 is in direct contact with groove 218, when annular member 210 of inner contact 201 is coupled to connection end 101 of pin 53' as described herein. Accordingly, inner contact 201 includes severed annular member 210, prongs 225 are carried by severed annular member 210, severed annular member 210 is seated in groove 218, and inner contact 201 is electrically connected to pin 53' at connection end 101, when inner contact 201 and pin 53' are assembled, namely, when annular member 210 of inner contact 201 is coupled to connection end 101. Annular member 210, a severed tensionable, annular member, is dimensioned to be received under tension within annular groove 218 formed in perimeter edge 101A of connection end 101 of pin 53' in FIG. 15 when lower second radial surface 212 is positioned directly against connection surface 101A. Groove 218 encircles prongs 225, which are arranged annularly inboard of groove 218 opposite to connection surface 101A, when inner contact 201 and pin 53' are assembled. Inner contact 201 is a part of pin 53', forming an exemplary pin assembly according to the invention, when inner contact 201 and pin 53' are assembled in FIGS. 14-18.

In assembly 200, pin 53' is electrically conductive, includes connector end 100, connection end 101, and inner contact 201. Inner contact 201 is carried by connection end 101, namely the contact seat in connection end 101 formed by connection surface 101A and groove 218, forming a pin assembly, is electrically connected to pin 53' at connection end 101, and includes flexible prongs 225.

In FIG. 17, pin 53' is situated in area A1, and is carried by body 52'. Pin 53' is press-fit into hole 94 of body 52'. Connection end 101 is fit or otherwise seated in counterbore 85, which is dimensioned to receive connection end 101, is located proximate to area A2, and prongs 225 extend outwardly from connection surface 101A of connection end 101 beyond connection end 101 into area A2 in the direction of opening 76. Pin 53' extends away from area A2 through area A1 from connection end 101 proximate to area A2 through hole 94 from cable end surface 92 to connector end surface 91 and beyond connector end surface 91 of body 52' in area A1 to connector end 100 as described above in connection with assembly 50.

Figure 12:
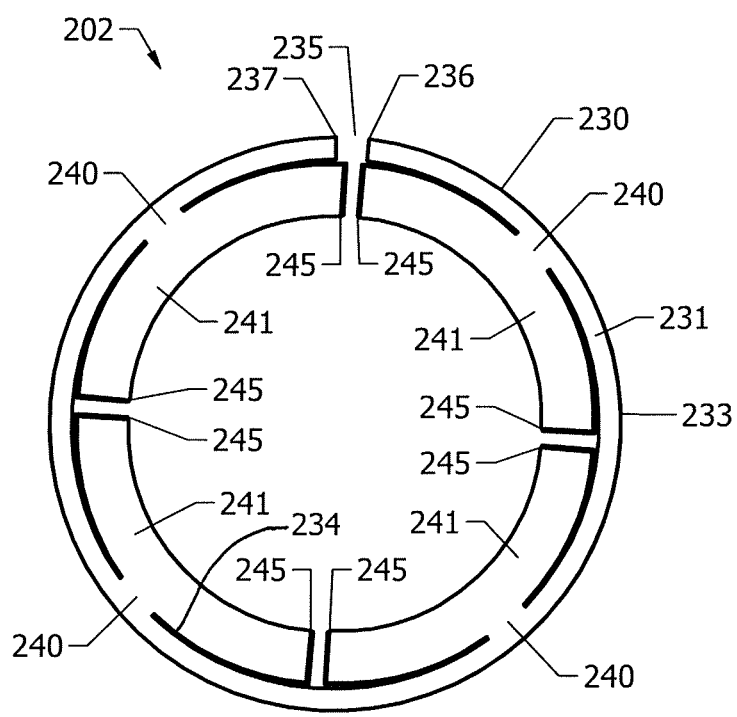
FIG. 12 is a top plan view of an outer contact of the embodiment of FIG. 9
Figure 13:
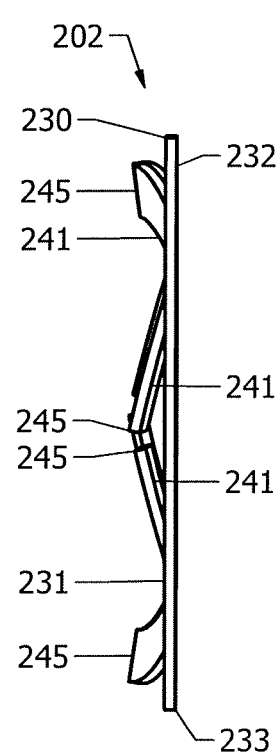
FIG. 13 is a perspective view of the embodiment of FIG. 12.
Figure 14:
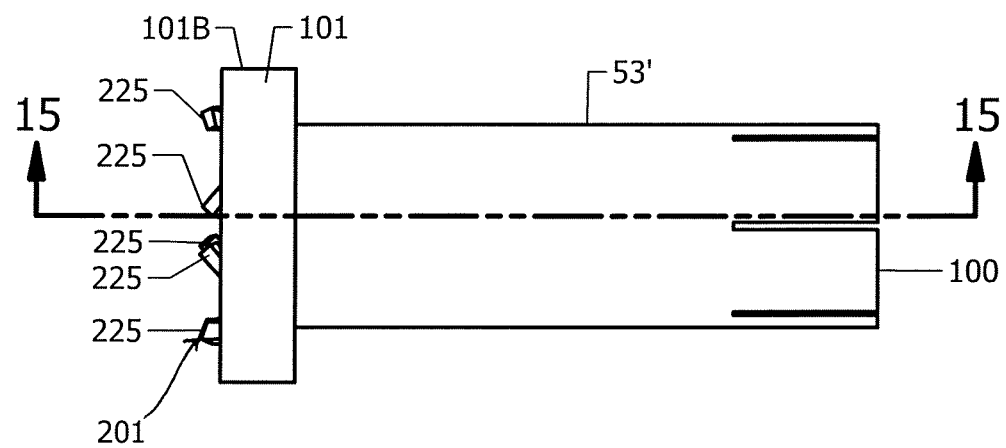
FIG. 14 is a side elevation view of a radio frequency (RF) connector pin of the embodiment of FIG. 9.

Outer contact 202 is identical structurally to inner contact 201 only larger. In FIGS. 12 and 13, outer contact 202 includes annular member 230, and prongs 245. Prongs 245 are carried by, or otherwise are supported by, annular member 230, which is severed annular member as described below. Annular member 230 has an upper first radial surface 231, a lower second radial surface 232, an outer surface 233, an opposed inner surface 234, and an end gap 235 that severs annular member 230 and that defines spaced-apart first and second ends 236 and 237 of annular member 230.

In FIGS. 12 and 13, annularly spaced-apart tabs 240 extend inwardly from inner surface 234, and connect inner surface 234 to annularly spaced-apart, outwardly curved, elongate members 241 each having opposed free ends that are out-turned upwardly relative to upper first radial surface 231 forming prongs 245. Each tab 240 connects a middle of a corresponding elongate member 241 to inner surface 234, and each elongate member 241 extends outwardly from either side of the corresponding tab 240 to its corresponding prongs 245. Inner surface 234 encircles elongate members 224. Prongs 245, the opposed, up-turned free ends of elongate members 241, extend upwardly relative to upper first radial surface 231, and extend outwardly into area A2 from step 78 and upper first radial surface 231 in FIG. 17 when outer contact 202 is installed with fixture 51. Prongs 245 are inherently springy/flexible and flex when under pressure, and have an inherent shape memory material characteristic enabling prongs to recover and resume their original shapes in the absence of applied pressure. In FIG. 17, annular member 230 is positioned in area A2, lower second radial surface is positioned directly against step 78, annular member 230 is received under tension within annular groove 238 formed in fixture 51, and prongs 245 extend outwardly into area A2 from step 78 and into area A2 away from upper first radial surface 231 in the direction of opening 76.

Groove 238 is an outwardly directed groove in that it extends into inner surface 62 outwardly relative axis X in assembly 200. Annular member 230, a severed tensionable, annular member, is dimensioned to be received under tension within annular groove 238 formed in inner surface 62 of fixture 51 from area A2 proximate to step 78 in FIG. 17 when outer contact 202 is in area A2 and when lower second radial surface 232 is positioned directly against step 78 in area A2. Annular member 230 is elastically expansive and, thus, has an inherent expansive property or characteristic. To assembly outer seal 202 and fixture 51, annular member 230 is initially closed, bringing first and second ends 236 and 237 together closing end gap 235, such as by hand, outer seal 202 is inserted into area A2 through opening 76 and lower second radial surface 212 initially seated in direct contact against step 78, and is then released enabling annular member 210 to snap outwardly into groove 238. Annular member 230 is tensioned due to its inherent expansive characteristic urging outer surface 233 in engagement against groove 238, when annular member 230 installs in groove 238. Lower second radial surface 232 is in direct contact with step 78 of fixture 51 and annular member 230 is in direct contact with groove 238 of fixture 51, when annular member 230 of outer contact 201 is coupled to connection end 101 of pin 53' as described herein. Accordingly, outer contact 201 includes severed annular member 230, prongs 245 are carried by severed annular member 230, severed annular member 230 is seated in groove 238, and outer contact 202 is electrically connected to fixture 51, when outer contact 202 and fixture 51 are assembled, namely, when annular member 230 of outer contact 202 is coupled to fixture 51. Annular member 230, a severed tensionable, annular member, is dimensioned to be received under tension within annular groove 238 formed in fixture 51 in FIG. 17 when lower second radial surface 232 is positioned directly against connection step 78 in area A2. And so in assembly 200, outer contact 202 is carried by fixture 51, specifically by a contact seat in fixture 51, namely, step 78 and groove 238, is electrically connected to fixture 51, and includes flexible prongs 245 that extend outwardly into area A2 opposite to step 78 in the direction of opening 76.

Inner and outer contacts 201 and 202 are coaxial and are arranged about axis X in assembly 200. Outer contact 202 relates to the outer conductor of a coaxial cable end to be tested, and encircles inner contact 201 that relates to the inner conductor of the coaxial cable end to be tested.

Figure 18:
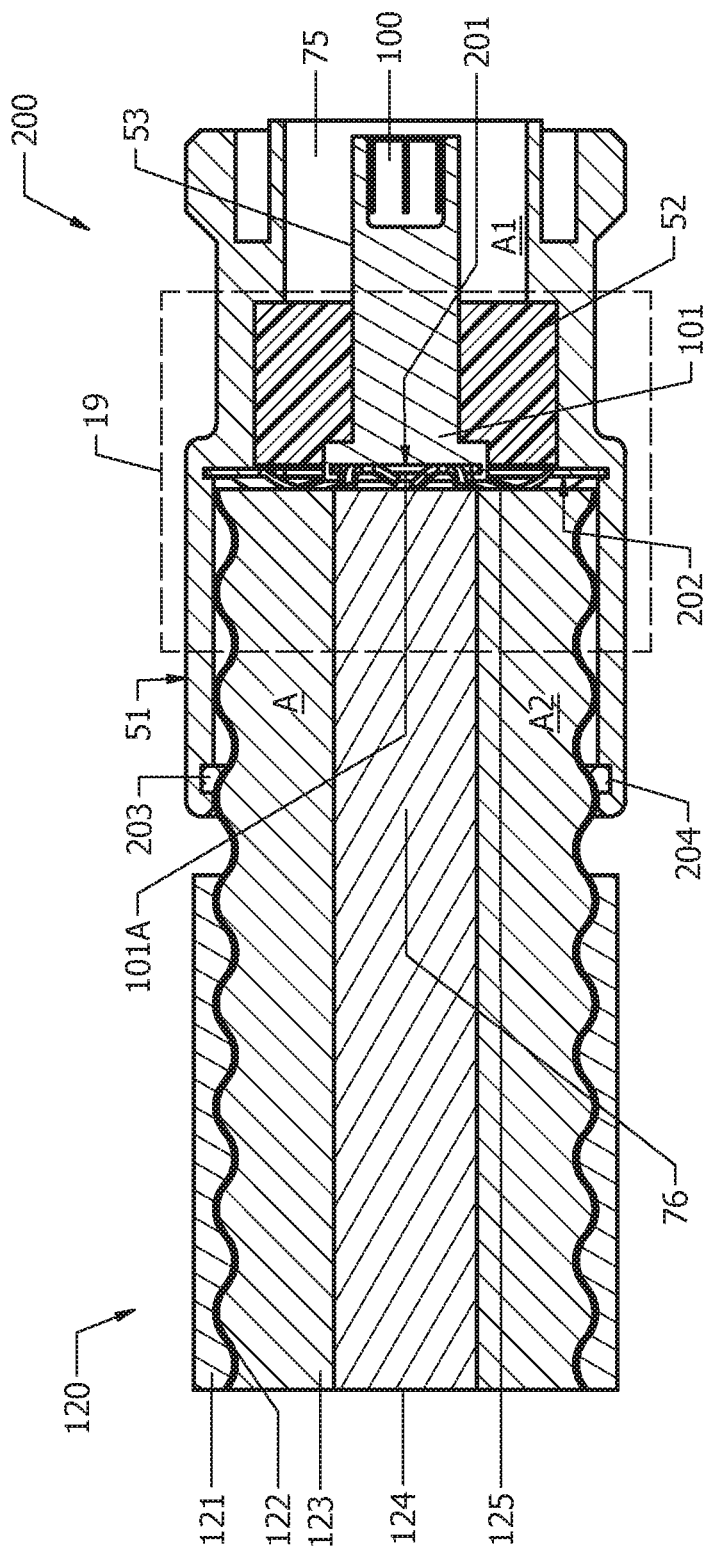
FIG. 18 is a section view corresponding to FIG. 17 illustrating the connector assembly of FIGS. 9, 16, and 17 as it would appear connected to a coaxial cable to be tested.

FIG. 18 is a section view corresponding to FIG. 17 illustrating a coaxial cable shown as it would appear connected to assembly 200 of FIGS. 9, 16, and 17. Referring in relevant part to FIG. 18 and also FIG. 19, which is an enlarged view of the area encircled by the dotted outline in FIG. 18, the previously-described cable 120 includes outer jacket 121, outer conductor 122, dielectric 123, and inner conductor 124. End 125 of cable 120 is stripped of outer jacket 121, exposing outer conductor 122. End 125 is inserted into area A2, the receiving area or cable-receiving area of assembly 200, through opening 76 of section 81 of assembly 200. Assembly 200 is slipped over and is pressed onto and over end 125, such as by hand without the need for specialized skill or tools. Concurrently, inner surface 62 of counterbore 72 of fixture 51 frictionally engages outer conductor 122 of cable 120 end 125, outer conductor 122 of cable 120 end 125 electrically contacts prongs 245 of outer contact 202, inner conductor 124 of cable 120 end 125 electrically contacts prongs 225 of inner contact 201, and gasket 203 applied to annular groove 204 formed in inner surface 62 of counterbore 72 proximate to opening 76 at cable end 64 of fixture 51 seals against outer conductor 12 forming a water-tight seal for disabling water/moisture from migrating past gasket 203 into volume A2 and interfering with the electrical contact of inner and outer contacts 201 and 202 with inner and outer conductors 124 and 122. The concurrent electrical contact of outer conductor 122 to prongs 245 of outer contact 202 and inner conductor 124 to prongs 225 of inner contact 201 electrically connects outer conductor 122 to fixture 51 and electrically connects inner conductor 124 to pin 53', completing the connection from cable end 125 to the connector section 80, the RF connector end of assembly 200. Inner contact 201 and outer contact 202 electrically contact coaxial inner and outer conductors 124 and 122, respectively, of end 125 of cable 120 concurrently electrically connecting end 125 of cable 110 to fixture 51 and to pin 53', body 53' electrically isolates pin 53' from fixture 51, and fixture 53' frictionally engages cable 120, when end 125 of cable 120 is inserted into area A2. After cable 120 is tested with assembly 200 by connecting section 80 to the chosen test equipment, assembly 200 can be taken up by hand or with a tool and simply pulled free of cable 120 end 125. Again, assembly 200 can be used repeatedly to test cables as needed. Like assembly 50, assembly 200 can be used repeatedly to test cables as needed and can be similarly used with cables 110, 130, 140, and 150 as described in conjunction with assembly 50.

Figure 19:
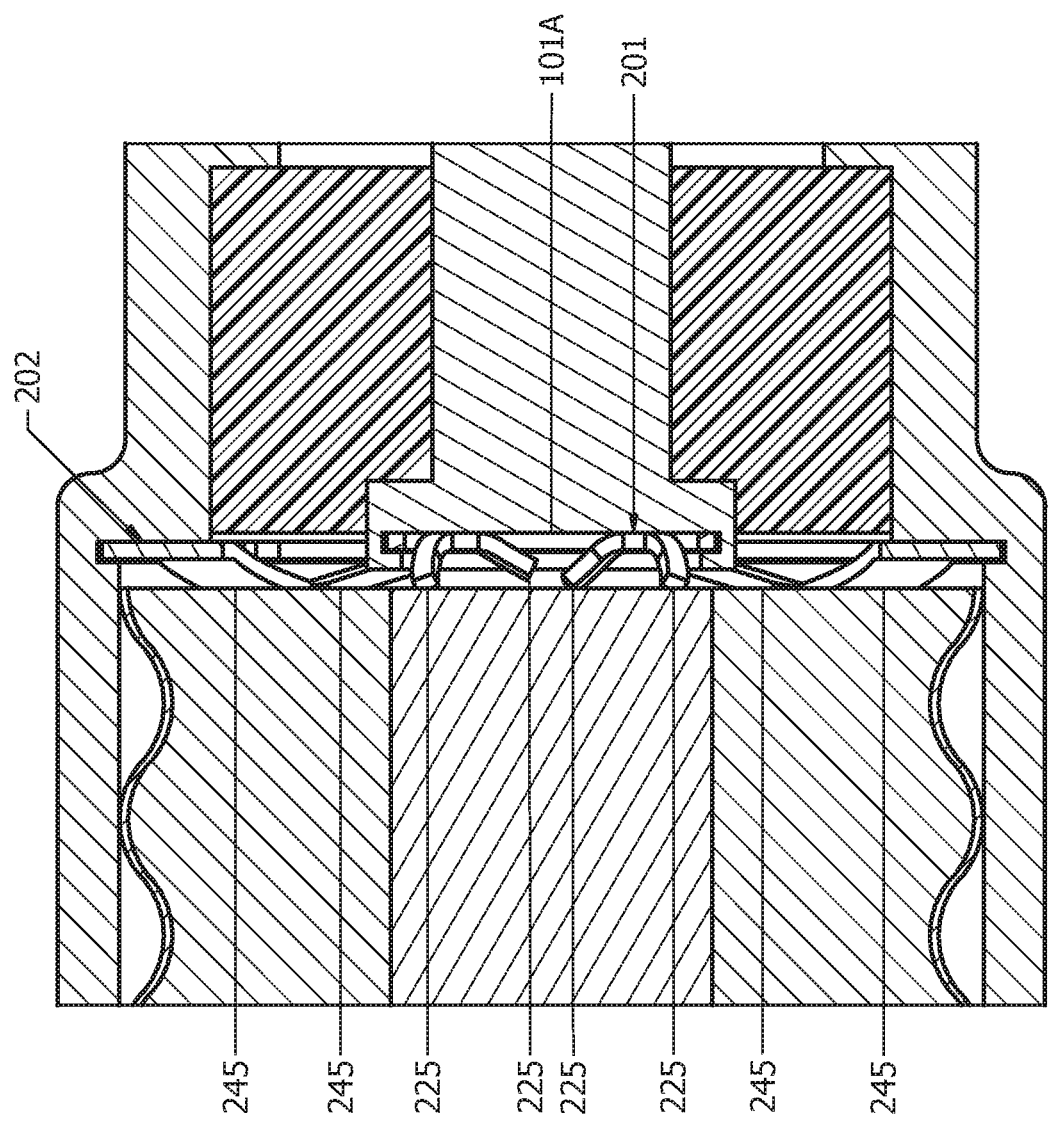
FIG. 19 is enlarged view corresponding to the area encircled by the dotted outline 19 in FIG. 18.

In FIGS. 18 and 19, prongs 225 of inner contact 201 inherently provide compliance to ensure electrical contact with inner conductor 124, in that prongs 225 deflect and electrically contact inner conductor 124 of end 125 of cable 120, when end 125 of cable 120 is inserted into area A2. Prongs 245 of outer contact 202 also inherently provide compliance to ensure electrical contact with outer conductor 122, in that prongs 245 deflect and electrically contact outer conductor 122 of end 125 of cable 120, when end 125 of cable 120 is inserted into area A2. Prongs 225 and 245 recover, return to their original shapes, their non-deflected shapes, when assembly 200 is withdrawn from end 125 of cable 120. Prongs 225 and 245 of inner and outer contact 201 and 202 are inherently flexible and resilient, compress/deflect from their at-rest orientations to enable competent electrical contact to the inner and outer conductors of the corresponding coaxial cable to be tested when the given coaxial cable is inserted into area A2, and recover or reset to their at-rest orientations, their uncompressed/unflexed orientations, when the given tested coaxial cable is withdrawn from area A2. If desired, the previously-described assembly 50 can be configured with groove 238 and outer contact 55 can be replaced with outer contact 202.

The invention has been described above with reference to illustrative embodiments. However, those skilled in the art will recognize that changes and modifications may be made to the embodiments without departing from the nature and scope of the invention. Various changes and modifications to the embodiments herein chosen for purposes of illustration will readily occur to those skilled in the art. To the extent that such modifications and variations do not depart from the spirit of the invention, they are intended to be included within the scope thereof.

Having fully described the invention in such clear and concise terms as to enable those skilled in the art to understand and practice the same, the invention claimed is:

1. A coaxial cable testing assembly, comprising:
   a fixture, the fixture is electrically conductive and includes a first section and a second section, the first section defines an opening and a receiving area adapted to receive an end of a coaxial cable through the opening;
   a body carried by the second section, the body is electrically insulative and extends away from the receiving area from a cable end surface of the body to a connector end surface of the body;
   a radio frequency (RF) connector pin, the RF connector pin is electrically conductive, includes a connection end and a connector end, and is carried by the body, the RF connector pin extends away from the receiving area through the body from the connection end proximate to the receiving area and the cable end surface to and beyond the connector end surface to the connector end;
   an inner contact, the inner contact is electrically connected to the RF connector pin at the connection end and extends away from the connection end of the RF connector pin and the cable end surface of the body to into the receiving area toward the opening;
   an outer contact, the outer contact is electrically connected to the fixture and extends away from the connection end of the RF connector pin and the cable end surface of the body to into the receiving area toward the opening; and
   the inner contact and the outer contact electrically contact coaxial inner and outer conductors, respectively, of the end of the coaxial cable concurrently electrically connecting the end of the coaxial cable to the fixture and to the RF connector pin, the body electrically isolates the RF connector pin from the fixture, and the fixture frictionally engages the coaxial cable, when the end of the coaxial cable is inserted into the receiving area through the opening.

2. The coaxial cable testing assembly according to claim 1, wherein the connector end of the RF connector pin resides in a connector area defined by the second section of the fixture.

3. The coaxial cable testing assembly according to claim 1, wherein the outer contact and the inner contact are coaxial.

4. The coaxial cable testing assembly according to claim 1, wherein the outer contact comprises:
   flexible prongs carried by an annular member seated in an annular groove formed in the fixture, the prongs extend away from the annular member and from the connection end of the RF connector pin and the cable end surface of the body to into the receiving area toward the opening and deflect and electrically contact the outer conductor of the end of the coaxial cable when the end of the coaxial cable is inserted into the receiving area through the opening;
   an end gap severs the annular member and defines spaced-apart ends of the annular member; and
   the annular member is tensioned urging the annular member against the annular groove.

5. The coaxial cable testing assembly according to claim 1, wherein the inner contact comprises:
   flexible prongs carried by an annular member seated in an annular groove formed in the connection end of the RF connector pin, the prongs extend away from the annular member and from the connection end of the RF connector pin and the cable end surface of the body to into the receiving area toward the opening and deflect and electrically contact the inner conductor of the end of the coaxial cable when the end of the coaxial cable is inserted into the receiving area through the opening;
   an end gap severs the annular member and defines spaced-apart ends of the annular member; and
   the annular member is tensioned urging the annular member against the annular groove.

6. A coaxial cable testing assembly, comprising:
a fixture, the fixture is electrically conductive and includes a first section and a second section, the first section defines a first area and an opening to the first area and the second section defines a second area;
a body carried by the second section in the second area, the body is electrically insulative and extends away from the first area from a cable end surface of the body to a connector end surface of the body;
a radio frequency (RF) connector pin, the RF connector pin is electrically conductive, includes a connection end and a connector end, and is carried by the body, the RF connector pin extends away from the first area through the second area through the body from the connection end proximate to the first area and the cable end surface to and beyond the connector end surface to the connector end;
the connector end of the RF connector pin resides in a connector area of the second area defined by the second section of the fixture;
an inner contact and an outer contact in the first area;
the inner contact is electrically connected to the RF connector pin at the connection end and extends away from the connection end of the RF connector pin and the cable end surface of the body to into the first area toward the opening;
the outer contact is electrically connected to the fixture and extends away from the connection end of the RF connector pin and the cable end surface of the body to into the first area toward the opening; and
the inner contact and the outer contact electrically contact coaxial inner and outer conductors, respectively, of an end of a coaxial cable concurrently electrically connecting the end of the coaxial cable to the fixture and to the RF connector pin, the body electrically isolates the RF connector pin from the fixture, and the fixture frictionally engages the coaxial cable, when the end of the coaxial cable is inserted into the first area through the opening.

7. The coaxial cable testing assembly according to claim 6, wherein the first area, the second area, and the RF connector pin are coaxial.

8. The coaxial cable testing assembly according to claim 6, wherein the outer contact and the inner contact are coaxial.

9. The coaxial cable testing assembly according to claim 6, wherein the outer contact comprises:
flexible prongs carried by an annular member seated in an annular groove formed in the fixture, the prongs extend away from the annular member and from the connection end of the RF connector pin and the cable end surface of the body to into the first area toward the opening and deflect and electrically contact the outer conductor of the end of the coaxial cable when the end of the coaxial cable is inserted into the first area through the opening;
an end gap severs the annular member and defines spaced-apart ends of the annular member; and
the annular member is tensioned urging the annular member against the annular groove.

10. The coaxial cable testing assembly according to claim 6, wherein the inner contact comprises:
flexible prongs carried by an annular member seated in an annular groove formed in the connection end of the RF connector pin, the prongs extend away from the annular member and from the connection end of the RF connector pin and the cable end surface of the body to into the first area toward the opening and deflect and electrically contact the inner conductor of the end of the coaxial cable when the end of the coaxial cable is inserted into the first area through the opening;
an end gap severs the annular member and defines spaced-apart ends of the annular member; and
the annular member is tensioned urging the annular member against the annular groove.

11. A coaxial cable testing assembly, comprising:
a fixture, the fixture is electrically conductive and includes a first section and a second section, the first section defines an opening and a receiving area adapted to receive an end of a coaxial cable through the opening;
a body carried by the second section, the body is electrically insulative and extends away from the receiving area from a cable end surface of the body to a connector end surface of the body;
a radio frequency (RF) connector pin, the RF connector pin is electrically conductive, includes a connection end, a connector end, and an inner contact, the inner contact is carried by the connection end, is electrically connected to the RF connector pin at the connection end, and comprises flexible prongs, the RF connector pin extends away from the receiving area through the body from the connection end proximate to the receiving area and the cable end surface to and beyond the connector end surface to the connector end and the flexible prongs extend away from the connection end of the RF connector pin and the cable end surface of the body to into the receiving area toward the opening;
an outer contact electrically connected to the fixture and extends away from the connection end of the RF connector pin and the cable end surface of the body to into the receiving area toward the opening;
the flexible prongs of the inner contact deflect and electrically contact an inner conductor of the end of the coaxial cable and the outer contact electrically contacts an outer conductor of the end of the coaxial cable, concurrently electrically connecting the end of the coaxial cable to the fixture and to the RF connector pin, the body electrically isolates the RF connector pin from the fixture, and the fixture frictionally engages the coaxial cable, when the end of the coaxial cable is inserted into the receiving area through the opening.

12. The coaxial cable testing assembly according to claim 11, wherein:
the flexible prongs are carried by an annular member seated in an annular groove formed in the connection end of the RF connector pin, the prongs extend away from the annular member and from the connection end of the RF connector pin and the cable end surface of the body to into the receiving area toward the opening;
an end gap severs the annular member and defines spaced-apart ends of the annular member; and
the annular member is tensioned urging the annular member against the annular groove.

13. The coaxial cable testing assembly according to claim 11, wherein the connector end of the RF connector pin resides in a connector area defined by the second section of the fixture.

14. The coaxial cable testing assembly according to claim 11, wherein the outer contact and the inner contact are coaxial.

15. A coaxial cable testing assembly, comprising:
a fixture, the fixture is electrically conductive and includes a first section and a second section, the first section defines an opening and a receiving area adapted to receive an end of a coaxial cable through the opening;

a body carried by the second section, the body is electrically insulative and extends away from the receiving area from a cable end surface of the body to a connector end surface of the body;

a radio frequency (RF) connector pin, the RF connector pin is electrically conductive, includes a connection end and a connector end, and is carried by the body, the RF connector pin extends away from the receiving area through the body from the connection end proximate to the receiving area and the cable end surface to and beyond the connector end surface to the connector end;

an inner contact electrically connected to the RF connector pin at the connection end, the inner contact extends away from the connection end of the RF connector pin and the cable end surface of the body to into the receiving area toward the opening;

an outer contact, the outer contact is carried by the fixture, is electrically connected to the fixture, and comprises flexible prongs extending away from the connection end of the RF connector pin and the cable end surface of the body to into the receiving area toward the opening;

the inner contact electrically contacts an inner conductor of the end of the coaxial cable and the flexible prongs of the outer contact deflect and electrically contact an outer conductor of the end of the coaxial cable, concurrently electrically connecting the end of the coaxial cable to the fixture and to the RF connector pin, the body electrically isolates the RF connector pin from the fixture, and the fixture frictionally engages the coaxial cable, when the end of the coaxial cable is inserted into the receiving area through the opening.

16. The coaxial cable testing assembly according to claim 15, wherein:

the flexible prongs are carried by an annular member seated in an annular groove formed in the fixture, the prongs extend away from the annular member and from the connection end of the RF connector pin and the cable end surface of the body to into the first area toward the opening and deflect and electrically contact the outer conductor of the end of the coaxial cable when the end of the coaxial cable is inserted into the first area through the opening;

an end gap severs the annular member and defines spaced-apart ends of the annular member; and the annular member is tensioned urging the annular member against the annular groove.

17. The coaxial cable testing assembly according to claim 15, wherein the connector end of the RF connector pin resides in a connector area defined by the second section of the fixture.

18. The coaxial cable testing assembly according to claim 15, wherein the outer contact and the inner contact are coaxial.

* * * * *